(12) United States Patent
Suh et al.

(10) Patent No.: US 7,714,324 B2
(45) Date of Patent: May 11, 2010

(54) ORGANIC THIN FILM TRANSISTOR AND METHOD OF MANUFACTURING THE SAME

(75) Inventors: Min-Chul Suh, Suwon-si (KR); Taek Ahn, Suwon-si (KR); Jin-Seong Park, Suwon-si (KR)

(73) Assignee: Samsung Mobile Display Co., Ltd., Yongin, Gyunggi-do (KR)

( * ) Notice: Subject to any disclaimer, the term of this patent is extended or adjusted under 35 U.S.C. 154(b) by 0 days.

(21) Appl. No.: 11/527,894

(22) Filed: Sep. 26, 2006

(65) Prior Publication Data
US 2007/0158648 A1    Jul. 12, 2007

(30) Foreign Application Priority Data
Dec. 15, 2005    (KR) ............... 10-2005-0123997

(51) Int. Cl.
*H01L 51/10*    (2006.01)
(52) U.S. Cl. ............ 257/40; 257/E51.006; 438/99
(58) Field of Classification Search .......... 257/E39.007, 257/E51.005, E51.006, E51.027, 40; 438/99
See application file for complete search history.

(56) References Cited

U.S. PATENT DOCUMENTS

| | | | |
|---|---|---|---|
| 6,855,949 B2* | 2/2005 | De Leeuw et al. ............ 257/40 |
| 6,913,944 B2* | 7/2005 | Hirai ............................ 438/99 |
| 2002/0135710 A1* | 9/2002 | Chae ............................ 349/43 |
| 2003/0175850 A1* | 9/2003 | Ross et al. ..................... 435/34 |
| 2004/0222412 A1* | 11/2004 | Bai et al. ...................... 257/40 |
| 2005/0056828 A1* | 3/2005 | Wada et al. ................... 257/40 |
| 2005/0056897 A1* | 3/2005 | Kawasaki et al. ........... 257/359 |
| 2005/0269568 A1* | 12/2005 | Koo et al. ..................... 257/59 |
| 2006/0011908 A1* | 1/2006 | Ohsawa et al. ................ 257/40 |
| 2006/0027800 A1* | 2/2006 | MacPherson et al. ......... 257/40 |
| 2006/0043360 A1* | 3/2006 | Kim et al. ..................... 257/40 |
| 2006/0076556 A1* | 4/2006 | Hobara et al. ................. 257/40 |
| 2006/0081840 A1* | 4/2006 | Mori et al. .................... 257/40 |
| 2006/0145145 A1* | 7/2006 | Nishio .......................... 257/40 |
| 2006/0193080 A1* | 8/2006 | Chattopadhyay et al. .... 360/112 |

\* cited by examiner

*Primary Examiner*—Minh-Loan T Tran
*Assistant Examiner*—W. Wendy Kuo
(74) *Attorney, Agent, or Firm*—Knobbe Martens Olson & Bear LLP

(57) ABSTRACT

An organic TFT that has an improved contact between source and drain electrodes and an organic semiconductor layer, a method of manufacturing the same, and an organic light emitting display device having the organic TFT are disclosed. The organic TFT includes a substrate, a gate electrode disposed on the substrate, a gate insulating film covering the gate electrode, a source electrode and a drain electrode disposed on the gate insulating film, a peel-off preventive layer disposed on the gate insulating film to contact at least a portion of end surfaces of the source and drain electrodes, and an organic semiconductor layer that contacts the source and drain electrodes.

25 Claims, 5 Drawing Sheets

ORGANIC THIN FILM TRANSISTOR AND METHOD OF MANUFACTURING THE SAME

CROSS-REFERENCE TO RELATED APPLICATIONS

This application claims priority to and the benefit of Korean Patent Application No. 10-2005-0123997, filed on Dec. 15, 2005, in the Korean Intellectual Property Office, the disclosure of which is incorporated herein in its entirety by reference.

BACKGROUND OF THE INVENTION

1. Field of the Invention

The present invention relates to an organic thin film transistor (TFT) and a method of manufacturing the same, and more particularly, to an organic TFT having an improved contact between source/drain electrodes and an organic semiconductor layer.

2. Description of the Related Technology

Since the development of a polyacetylene polymer which is a conjugated organic polymer having semiconductor characteristics, transistors that use organic materials are actively applied to electronic devices and optical devices. The organic materials have advantages in that they can be synthesized in various ways and can be readily molded to a film or fiber shape, and also have flexibility, conductivity, and low manufacturing costs.

A silicon TFT typically includes a semiconductor layer having source and drain regions doped with a high concentration dopant and a channel region formed between the source and drain regions, a gate electrode located on a region corresponding to the channel region and insulated from the semiconductor layer, and source and drain electrodes respectively contacting the source and drain regions.

However, the silicon TFT having the above structure has drawbacks in that it has high manufacturing costs and is easily damaged by an external impact. In addition, the silicon TFT cannot use a plastic substrate since it is produced by a high temperature process, for example, at a temperature over 300° C.

Flat panel display devices, such as a liquid crystal display device or an organic light emitting display device, include switching devices for controlling pixel operation and TFTs for driving pixels. To provide a flexible display device with a slim and large screen, the use of a plastic substrate instead of a glass substrate has been studied. However, when a plastic substrate is used, as described above, the flat panel display device needs to be manufactured by a low temperature process. Accordingly, it is very difficult to use a plastic substrate for silicon TFTs in flat panel display devices.

Since the above problems may be solved by using an organic film as a semiconductor layer of a TFT, studies about organic TFTs or an organic film to be used as a semiconductor layer have been actively conducted.

FIGS. 1 and 2 are cross-sectional views illustrating portions of a method of manufacturing a conventional organic thin film. Referring to FIG. 1, after a gate electrode 21 and a gate insulating film 25 covering the gate electrode 21 are formed on a substrate 10, a conductive layer 22 is formed on the gate insulating film 25. Referring to FIG. 2, source and drain electrodes 23 are formed by etching the conductive layer 22.

As depicted in FIG. 2, empty spaces are formed at lower end portions of the source and drain electrodes 23 near interfaces with the gate insulating film 25 because the lower end portions of the source and drain electrodes 23 are undercut.

FIG. 3 is a photograph showing a cross-section of source and drain electrodes of an organic TFT. Referring to FIG. 3, an angle between an end surface of the source and drain electrodes 23 and an upper surface of the gate insulating film 25 is about 52° and thus, an empty space is formed under end portions of the source and drain electrodes 23.

In this way, when an organic semiconductor layer 27 is formed after the source and drain electrodes 23 are formed, as depicted in FIG. 4, the organic semiconductor layer 27 may not satisfactorily contact the end portions of the source and drain electrodes 23 due to the spaces 23a and 23b at the end portions of the source and drain electrodes 23. As a result, when a channel is formed in the organic semiconductor layer 27 by applying a predetermined signal to the gate electrode 21, the channel may not satisfactorily contact the source and drain electrodes 23. Accordingly, an electrical signal between the source and drain electrodes 23 may not be transmitted, thereby causing a malfunction.

SUMMARY OF CERTAIN INVENTIVE ASPECTS

One aspect of the invention provides an organic thin film transistor (TFT). The organic TFT comprises: a substrate; a first insulating layer over the substrate; a second insulating layer over the first insulating layer; a source electrode and a drain electrode, each being interposed between the first and second insulating layers, the source and drain electrodes being spaced apart with a gap therebetween, each of the source and drain electrodes having a side surface facing the gap; an organic semiconductor layer overlying the source and drain electrodes and underlying the second insulating layer, the organic semiconductor layer further comprising a portion filling the gap between the source and drain electrodes; and a polymeric filler layer interposed between at least one of the side surfaces of the source and drain electrodes and the portion of the organic semiconductor layer.

The first insulating layer may have a surface facing the second insulating layer, and at least one of the side surfaces of the source and drain electrodes and the surface of the first insulating layer may form an angle of less than 90 degrees. The at least one of the side surfaces of the source and drain electrodes and the surface of the first insulating layer may form a groove therebetween, and the polymeric filler layer may fill at least a portion of the groove. The polymeric filler layer may contact the at least one of the side surfaces of the source and drain electrodes and the portion of the organic semiconductor layer.

The polymeric filler layer may further comprise a portion interposed between the portion of the organic semiconductor layer and the first insulating layer. The organic semiconductor layer may comprise another portion extending laterally beyond at least one of the source and drain electrodes, and the polymeric filler layer may further comprise a portion interposed between the other portion of the organic semiconductor layer and the first insulating layer.

The polymeric filler layer may be formed of at least one material selected from the group consisting of poly(methyl methacrylate), polystyrene, poly(α-methyl styrene), and polyisobutylene. The source and drain electrodes may be formed of a noble metal. The organic TFT may further comprise a gate electrode interposed between the first insulating layer and the substrate, the gate electrode overlapping with the gap between the source and drain electrodes. The organic TFT may further comprise a gate electrode over the second insulating layer, the gate electrode overlapping with the gap between the source and drain electrodes. The substrate may be flexible.

Another aspect of the invention provides an electronic device comprising the organic TFT described above. The device may comprise an organic light-emitting display device.

Another aspect of the invention provides a method of making an organic thin film transistor (TFT). The method comprises: forming a first insulating layer over a substrate; forming a source electrode and a drain electrode over the first insulating layer such that the source and drain electrodes are spaced apart with a gap therebetween, each of the source and drain electrodes having a side surface facing the gap; forming a polymeric filler layer so as to contact at least a portion of the side surfaces of the source and drain electrodes; and forming an organic semiconductor layer over the source and drain electrodes and in the gap between the source and drain electrodes.

Forming the source and drain electrodes may comprise wet etching a metallic layer. The source and drain electrodes may be formed of a noble metal. Forming the polymeric filler layer may comprise spin coating a polymeric filler material. The polymeric filler layer may be formed of at least one material selected from the group consisting of poly(methyl methacrylate), polystyrene, poly(α-methyl styrene), and polyisobutylene.

The method may further comprise forming a gate electrode over the substrate prior to forming the first insulating layer. The method may further comprise, after forming the organic semiconductor layer: forming a second insulating layer over the organic semiconductor layer; and forming a gate electrode over the second insulating layer.

Yet another aspect of the invention provides an electronic device comprising an organic thin film transistor made by the method described above.

Another aspect of the invention provides an organic thin film transistor (TFT) that has improved contact between source and drain electrodes and an organic semiconductor layer, a method of manufacturing the same, and an organic light emitting display device having the organic TFT.

Yet another aspect of the invention provides an organic TFT comprising: a substrate; a gate electrode disposed on the substrate; a gate insulating film covering the gate electrode; a source electrode and a drain electrode disposed on the gate insulating film; a peel-off preventive layer disposed on the gate insulating film to contact at least a portion of end surfaces of the source and drain electrodes; and an organic semiconductor layer that contacts the source and drain electrodes.

An angle formed by at least a portion of end surfaces of the source and drain electrodes and an upper surface of the gate insulating film may be an acute angle. At least a portion of edges of the source and drain electrodes may be peeled-off from the gate insulating film at an interface between the source and drain electrodes and the gate insulating film, and the peel-off preventive layer may fill a gap between the peeled-off portions of the source and drain electrodes from the gate insulating film and the gate insulating film.

Another aspect of the invention provides an organic TFT comprising: a substrate; an insulating film disposed on the substrate; a source electrode and a drain electrode disposed on the insulating film; a peel-off preventive layer disposed on the insulating film to contact at least a portion of end surfaces of the source and drain electrodes; an organic semiconductor layer that contacts the source and drain electrodes; a gate insulating film disposed on the organic semiconductor layer; and a gate electrode disposed on the gate insulating film.

An angle formed by at least a portion of end surfaces of the source and drain electrodes and an upper surface of the insulating film may be an acute angle. At least a portion of edges of the source and drain electrodes may be peeled-off from the insulating film at an interface between the source and drain electrodes and the insulating film, and the peel-off preventive layer may fill a gap between the peeled-off portions of the source and drain electrodes from the insulating film and the gate insulating film. The peel-off preventive layer may be formed of a polymer material. The peel-off preventive layer may comprise PMMA, PS, poly(α-methyl styrene), or polyisobutylene. The source and drain electrodes may comprise a noble metal.

Another aspect of the invention provides an organic light emitting display device comprising an organic TFT and an organic light emitting device electrically connected to the organic TFT.

Yet another aspect of the invention provides a method of manufacturing an organic TFT, comprising: forming a gate electrode on a substrate; forming a gate insulating film covering the gate electrode; forming source and drain electrodes on the gate insulating film; forming a peel-off preventive layer on the gate insulating layer to contact at least a portion of end surfaces of the source and drain electrodes; and forming an organic semiconductor layer that contacts the source and drain electrodes.

The forming of the source and drain electrodes may comprise forming the source and drain electrodes by wet etching a conductive layer after the conductive layer is formed on the gate insulating film.

Another aspect of the invention provides a method of manufacturing an organic TFT, comprising: forming an insulating film on a substrate; forming source and drain electrodes on the insulating film; forming a peel-off preventive layer on the insulating film to contact at least a portion of end surfaces of the source and drain electrodes; forming an organic semiconductor layer that contacts the source and drain electrodes forming a gate insulating film on the organic semiconductor layer; and forming a gate electrode on the gate insulting layer.

The forming of the source and drain electrodes may comprise forming the source and drain electrodes by wet etching a conductive layer after the conductive layer is formed on the insulating film. The forming of the peel-off preventive layer may be performed using a spin coating method. The peel-off preventive layer may be formed of a polymer material. The peel-off preventive layer may be formed of PMMA, PS, poly (α-methyl styrene), or polyisobutylene. The source and drain electrodes may be formed of a noble metal.

BRIEF DESCRIPTION OF THE DRAWINGS

The above and other features and advantages of the invention will become more apparent by describing in detail exemplary embodiments thereof with reference to the attached drawings in which.

DETAILED DESCRIPTION OF CERTAIN INVENTIVE EMBODIMENTS

The invention will now be described more fully with reference to the accompanying drawings in which exemplary embodiments of the invention are shown.

Figure 5:
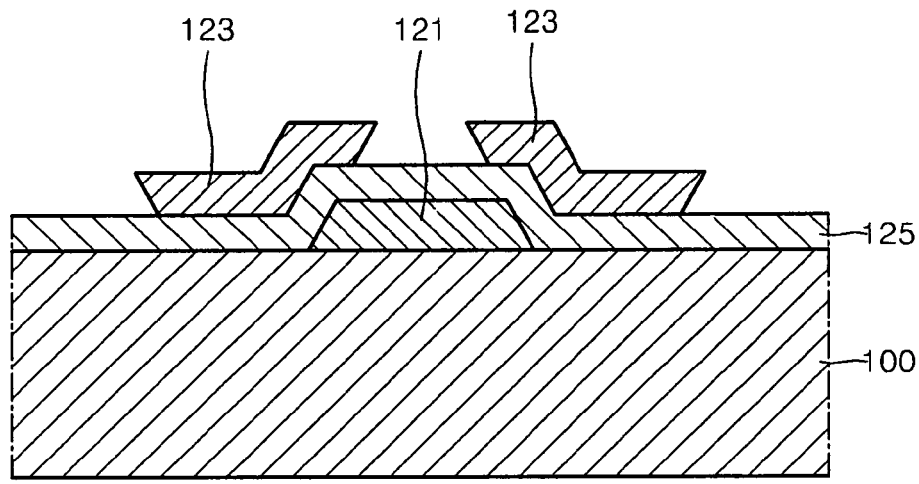
FIGS. 5 through 7 are cross-sectional views illustrating a method of manufacturing an organic TFT according to an embodiment.
Figure 6:
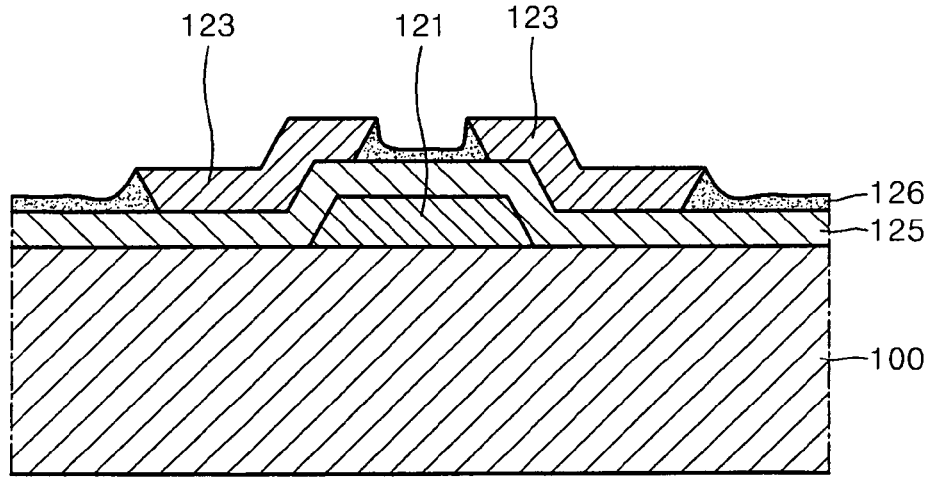
Figure 7:
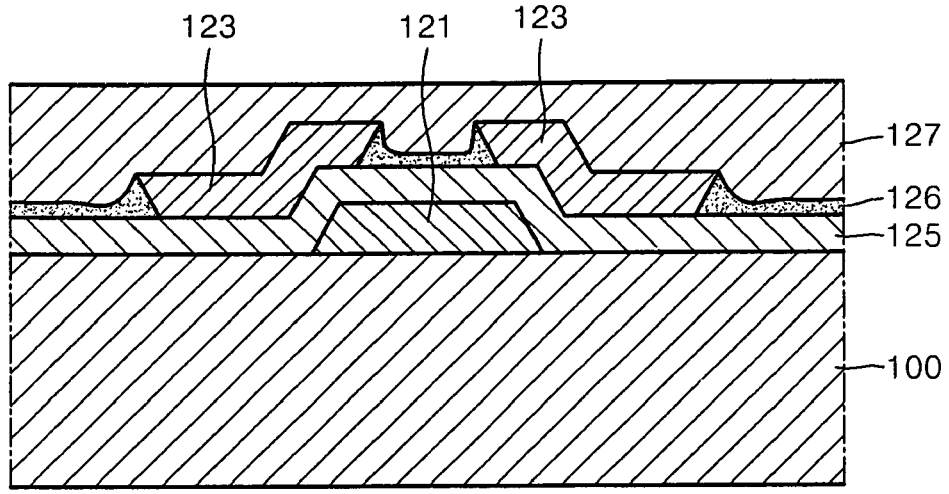

FIGS. 5 through 7 are cross-sectional views illustrating a method of manufacturing an organic TFT according to an embodiment. Referring to FIG. 5, a gate electrode 121 is formed on a substrate 100. A gate insulating film 125 is formed to cover the gate electrode 121. A conductive layer is formed on the gate insulating film 125. Source and drain electrodes 123 are formed on the gate insulating film 125 by etching the conductive layer.

The substrate 100 can be formed of glass or various other plastic materials such as acryl. In another embodiment, the substrate 100 may be formed of a metal foil.

The gate electrode 121 and the source and drain electrodes 123 can be formed of various conductive materials, for example, Mg, Al, Ni, Cr, Mo, W, MoW, or Au. The electrodes 121, 123 can be formed in various ways such as a single layer or multiple layers.

In one embodiment, the source and drain electrodes 123 may be formed of a noble metal. There may be a potential barrier between a conductive material such as Mg, Al, Ni, Cr, Mo, or W and an organic semiconductor layer. Therefore, electrical signals may not be transmitted between the source and drain electrodes 123 even though a channel is formed in the organic semiconductor layer when a predetermined electrical signal is applied to the gate electrode 121. This is known as a contact resistance. However, in the case of a noble metal such as Au, the contact resistance is not a problem since the potential barrier between the noble metal and the organic semiconductor layer is relatively small. Accordingly, in one embodiment, the source and drain electrodes 123 may be formed of a noble metal such as Au.

In one embodiment, the source and drain electrodes 123 may be formed by wet etching a conductive layer after the conductive layer has been formed. In such an embodiment, the conductive layer formed of a noble metal may not have a good contact with the gate insulating film 125 formed of an organic material or an inorganic material. That is, as depicted in FIG. 5, empty spaces or gaps are formed at lower end portions of the source and drain electrodes 123 near interfaces with the gate insulating film 125 since the lower end portions of the source and drain electrodes 123 are undercut. As a result, an angle between an end surface of at least a portion of edges of the source and drain electrodes 123 and an upper surface of the gate insulating film 125 is an acute angle.

Figure 1:
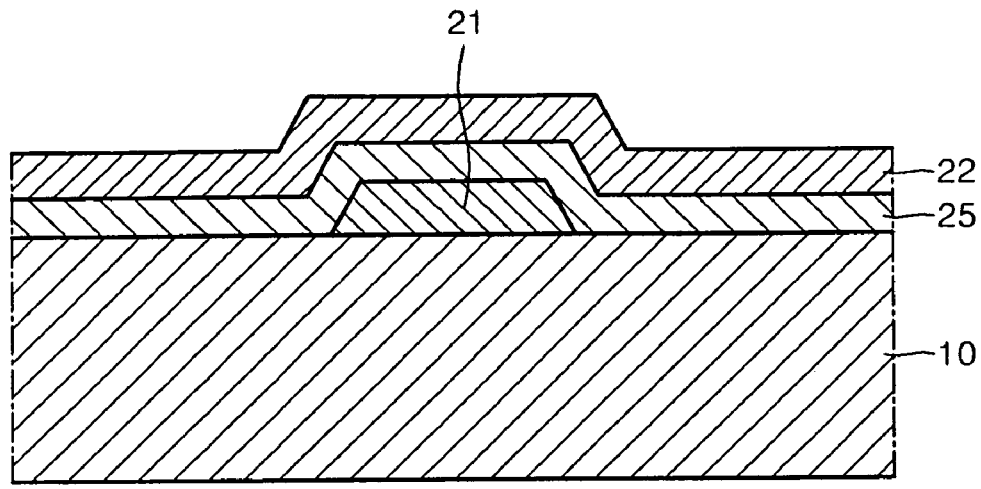
FIGS. 1 and 2 are cross-sectional views partially illustrating a method of manufacturing an organic TFT.
Figure 2:
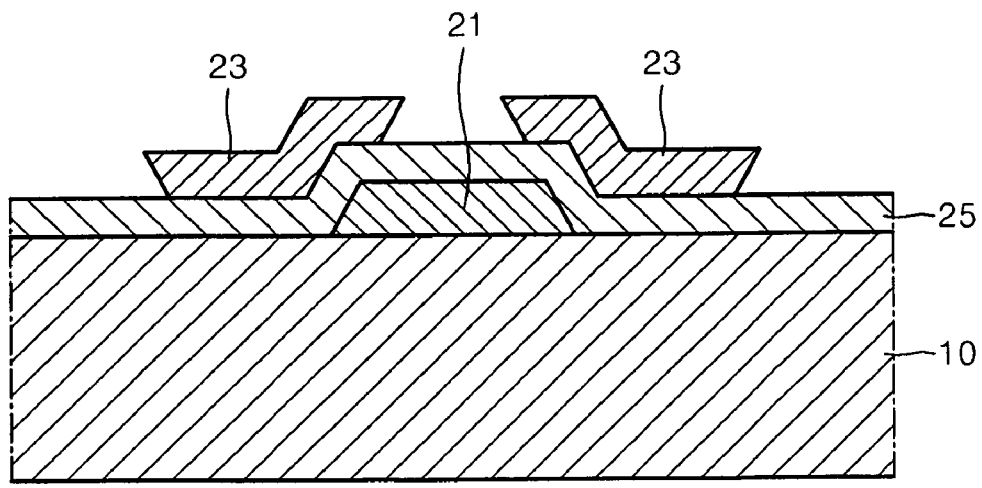
Figure 3:
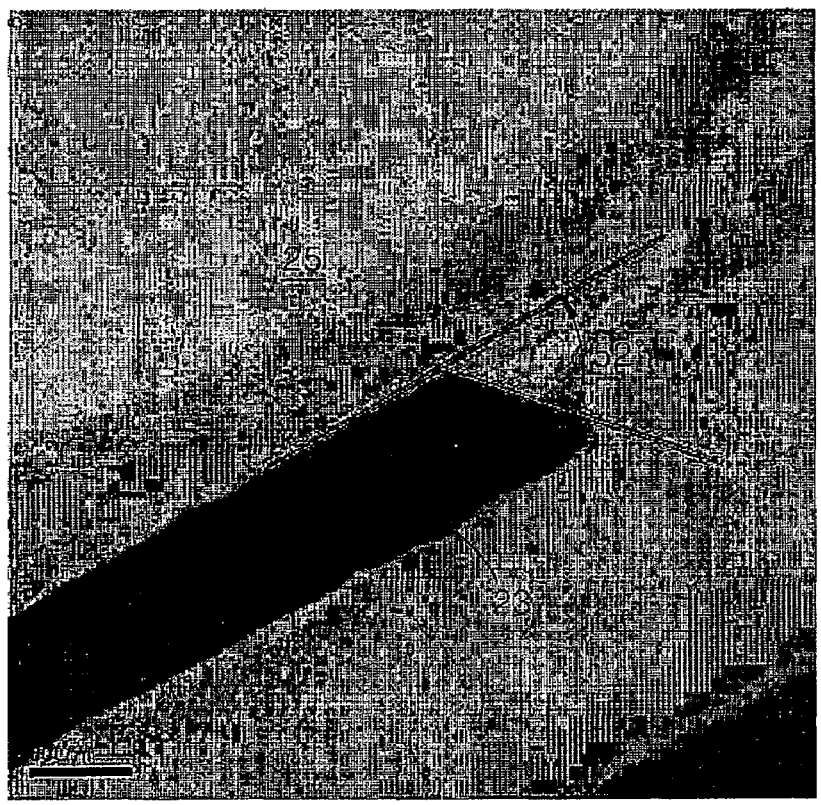
FIG. 3 is a photograph showing a cross-section of source and drain electrodes of an organic TFT.
Figure 4:
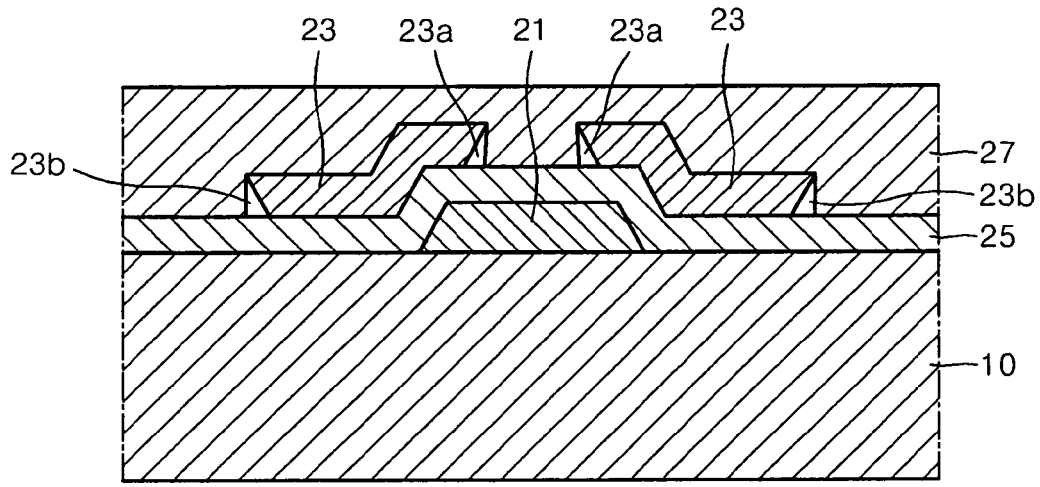
FIG. 4 is a cross-sectional view of an organic TFT manufactured using the processes depicted in FIGS. 1 and 2.

Therefore, when an organic semiconductor layer is formed after the source and drain electrodes 123 having the shape as depicted in FIG. 5 are formed, the organic semiconductor layer may not satisfactorily contact the source and drain electrodes 123 due to the spaces at the end portions of the source and drain electrodes 123. As a result, when a channel is formed in the organic semiconductor layer by applying a predetermined electrical signal to the gate electrode 121, the channel may not contact the source and drain electrodes 123. Therefore, electrical signals between the source and drain electrodes 123 may not be transmitted, thereby causing a malfunction. For example, when a channel is formed in the organic semiconductor layer, as depicted in FIG. 5, the channel is formed over an upper surface of the gate insulating film 125. Therefore, referring to the organic TFT as depicted in FIG. 4, when a channel is formed in the organic semiconductor layer 27 near the upper surface of the gate insulating film 25, the channel may not contact the source and drain electrodes 23 due to the spaces 23a. If the spaces are present, after an elapse of a certain period of time, the source and drain electrodes of the organic TFT may be peeled off from the gate insulating film.

Accordingly, in the organic TFT according to the present embodiment, as depicted in FIG. 6, a peel-off preventive film (or polymeric filler layer) 126 that can prevent the organic TFT from peeling off from the gate insulating film is provided. The peel-off preventive film 126 is formed on the gate insulating film 125 to contact at least end portions of the source and drain electrodes 123 using, for example, a spin coating method. Empty spaces formed at lower end portions of source and drain electrodes 123 are filled with the peel-off preventive film 126 since the peel-off preventive film 126 contacts the end portions of the source and drain electrodes 123.

In a manufacturing process, not only the spaces are generated, but also at least a portion of an end portion of the source and drain electrodes 123 may be peeled-off from the gate insulating film 125 at an interface between the gate insulating film 125 and the source and drain electrodes 123. In this case also, the peel-off preventive film 126 may fill a gap formed by the peeled-off portion of the source and drain electrodes 123.

The peel-off preventive film 126 may be formed of a polymer, for example, poly methyl methacrylate (PMMA), polystyrene (PS), poly(α-methyl styrene), or polyisobutylene, to effectively fill spaces of lower edges of the source and drain electrodes 123.

After the peel-off preventive film 126 is formed, as depicted in FIG. 7, an organic semiconductor layer 127 is formed to contact the source and drain electrodes 123. In this way, the manufacture of an organic TFT is completed.

The organic semiconductor layer 127 is formed of an organic material having semiconductor characteristics. In one embodiment, the organic semiconductor layer may be formed of at least one material selected from pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivatives, polythiophene and its derivatives, polyparaphenylenevinylene and its derivatives, polyparaphenylene and its derivatives, polyplorene and its derivatives, polythiopenevinylene and its derivatives, polythiophene-hetero ring aromatic copolymer and its derivatives, alpha-5-thiophene oligothiophene and its derivatives, phthalocianin that does not include a metal or that includes a metal and their derivatives, phyromeliticdianhydride and its derivatives, phyromelitic diimid and its derivatives, perrylenetetracarboxy acid dianhydride and its derivatives, and perrylenetetracarboxylic diimid and its derivatives. The organic semiconductor layer 127 can be formed using various methods such as an inkjet printing method, a stamping method, a dipping method, or a spin coating method.

When the organic TFT is manufactured as above, a channel formed in the organic semiconductor layer 127 can properly contact the source and drain electrodes 123 when a predetermined electrical signal is applied to the gate electrode 121. Since empty spaces are not present at lower edges of the source and drain electrodes 123, the source and drain electrodes 123 may not be peeled-off from the gate insulating film 125 formed under the source and drain electrodes 123 when the organic TFT is applied to a flexible display device, thereby preventing a malfunction of the flexible display device.

Figure 8:
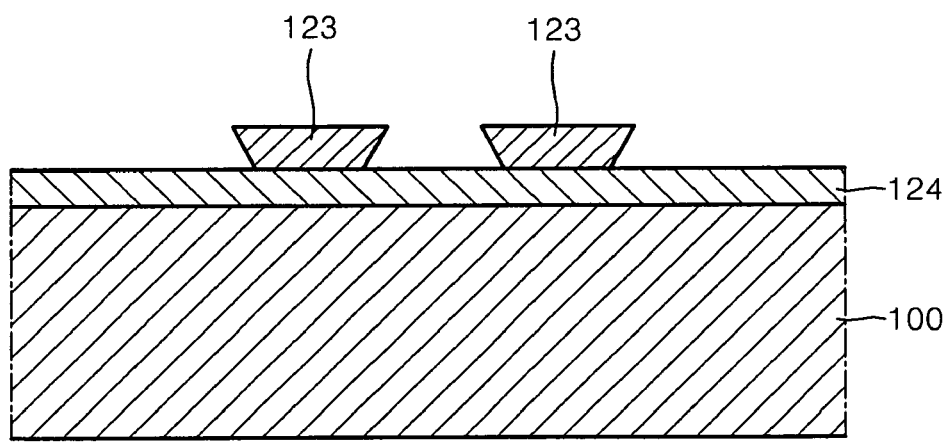
FIGS. 8 through 10 are cross-sectional views illustrating a method of manufacturing an organic TFT according to another embodiment.
Figure 9:
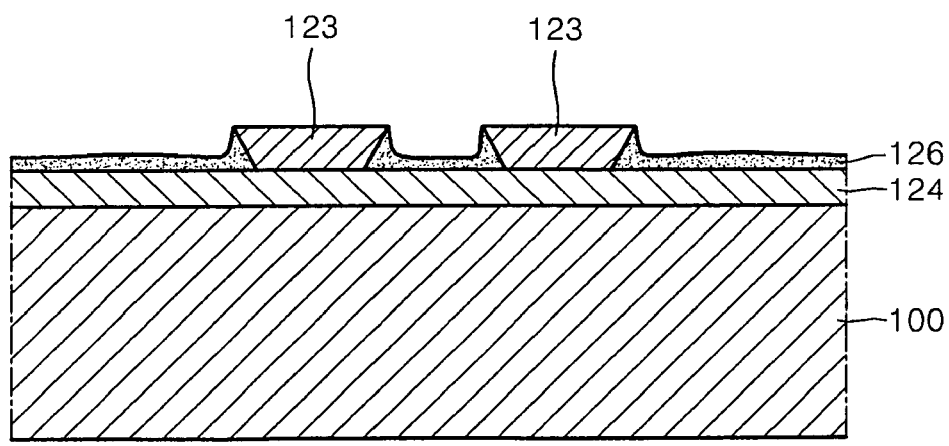
Figure 10:
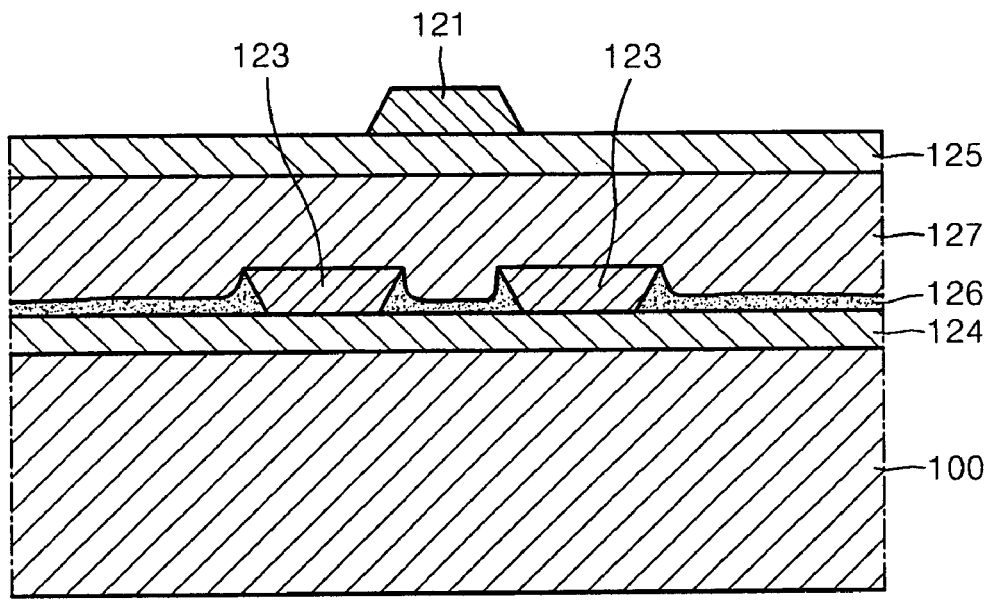

FIGS. 8 through 10 are cross-sectional views illustrating a method of manufacturing an organic TFT according to another embodiment. In the organic TFT described with reference to FIGS. 5 through 7, a bottom gate type organic TFT, in which a gate electrode is disposed under source and drain electrodes, have been described, but the invention is not limited thereto. That is, the invention can also apply to a top gate type organic TFT. In the top gate type organic TFT, a gate electrode is disposed over the source and drain electrodes.

As depicted in FIG. 8, an insulating film 124 can be formed over a substrate 100 prior to forming source and drain electrodes 123. In one embodiment, another element may be interposed between the insulating film 124 and the substrate 100. In another embodiment, the insulating film 124 may be a buffer layer to prevent penetration of impurities from the substrate 100. When the source and drain electrodes 123 are formed on the insulating film 124 after the formation of the insulating film 124 using an organic material or an inorganic material, as depicted in FIG. 8, spaces may also be formed on lower edges of the source and drain electrodes 123 by further etching at least a portion of a lower edge more than an upper edge.

As depicted in FIG. 9, the spaces may also be filled by forming a peel-off preventive film 126. After that, as depicted in FIG. 10, a failure-free organic TFT can be manufactured by forming an organic semiconductor layer 127, a gate insulating film 125, and a gate electrode 121.

Figure 11:
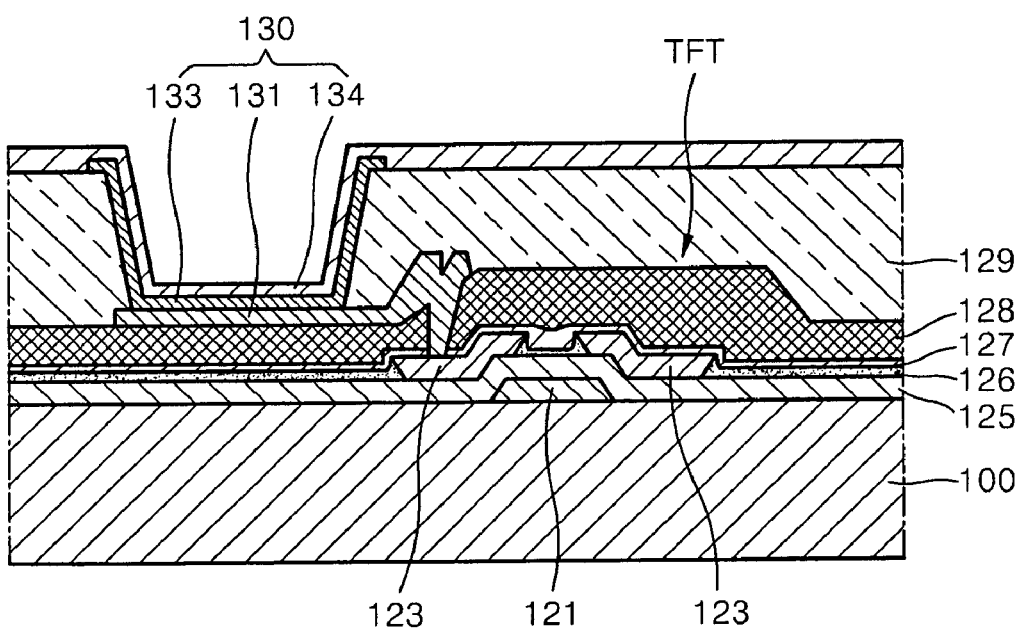
FIG. 11 is a cross-sectional view of an organic light emitting display device according to an embodiment.

FIG. 11 is a cross-sectional view of an organic light emitting display device according to an embodiment. The organic TFTs described above have good flexibility, and thus, they can be applied to various flexible flat display devices that use TFTs. The flexible flat display devices include various display devices such as liquid crystal display devices and organic light emitting display devices. Accordingly, an organic light emitting display device having the above organic TFT will now be briefly described with reference to FIG. 11.

In one embodiment, an organic light emitting display device includes organic TFTs described above and organic light emitting diodes formed over the TFTs. The illustrated organic light emitting display device is an active matrix (AM) type light emitting display device. A skilled artisan will appreciate that the TFT configuration described above can be applied to various other types of organic light emitting display devices.

Each pixel unit includes at least one organic TFT as depicted in FIG. 11. Referring to FIG. 11, a buffer layer (not shown) can be formed on a substrate 100 using $SiO_2$, if necessary. An organic TFT as described above can be formed on the buffer layer. The organic TFT depicted in FIG. 11 is one of the organic TFTs according to an embodiment or a modified embodiment, but the present invention is not limited thereto.

A passivation film 128 formed of $SiO_2$ is formed on the organic TFT, and a pixel defining film 129 formed of acryl or polyimide is formed on the passivation film 128. The passivation film 128 serves as a protective film for protecting the organic TFT and as a planarizing film for planarizing an upper surface of the organic TFT.

Although not depicted, at least one capacitor can be connected to the organic TFT. The circuit that includes the organic TFT is not limited to the circuit depicted in FIG. 11, and the circuit can have various modifications.

An organic light emitting device 130 is connected to one of the source and drain electrodes. The organic light emitting device 130 includes a pixel electrode 131 and a facing electrode 134 facing each other, and an intermediate layer 133 that includes at least a light emitting layer interposed between the pixel electrode 131 and the facing electrode 134. The facing electrode 134 can have various modifications. For example, the facing electrode 134 can be a common electrode to a plurality of pixels.

In FIG. 11, the intermediate layer 133 is patterned to correspond to sub-pixels. In other embodiments, the intermediate layer 133 can be formed in one unit with adjacent sub-pixels. Also, the intermediate layer 133 can have various modifications. For example, a portion of the intermediate layers 133 can be formed in each sub-pixel and the others of the intermediate layer 133 can be formed in one unit with intermediate layers of adjacent sub-pixels.

The pixel electrode 131 functions as an anode electrode and the facing electrode 134 functions as a cathode electrode. In other embodiments, the polarity of the first and second electrode layers can be reversed.

The pixel electrode 131 can be used as a transparent electrode or a reflection electrode. When the pixel electrode 131 is used as a transparent electrode, the pixel electrode 131 can be formed of ITO, IZO, ZnO or $In_2O_3$, and when the pixel electrode 131 is used as a reflection electrode, the pixel electrode 131 can be formed of ITO, IZO, ZnO or $In_2O_3$ on a reflection film after forming the reflection film using Ag, Mg, Al, Pt, Pd, Au, Ni, Nd, Ir, Cr, or a compound of these metals.

The facing electrode 134 can also be used as a transparent electrode or a reflection electrode. When the facing electrode 134 is used as the transparent electrode, the facing electrode 134 can include a layer formed of Li, Ca, LiF/Ca, LiF/Al, Al, Ag, Mg, or a compound of these metals and an auxiliary electrode or a bus electrode line formed on the layer by a material used to form the transparent electrode, such as ITO, IZO, ZnO or $In_2O_3$. When the facing electrode 134 is used as the reflection electrode, the facing electrode 134 is formed by entirely depositing Li, Ca, LiF/Ca, LiF/Al, Al, Ag, Mg, or a compound of these metals.

The intermediate layer 133 included between the pixel electrode 131 and the facing electrode 134 can be formed of a low molecular weight organic material or a polymer organic material. If the intermediate layer 133 is formed of a low molecular weight organic material, the intermediate layer 133 can be formed as a single or a composite structure by stacking a hole injection layer (HIL), a hole transport layer (HTL), an emission layer (EML), an electron transport layer (ETL), and an electron injection layer (EIL). An organic material that can be used for forming the intermediate layer 133 includes copper phthalocyanine (CuPc), N,N'-Di(naphthalene-1-yl)-N, N'-diphenyl-benzidine (NPB), and tris-8-hydroxyquinoline aluminum (Alq3). The intermediate layer 133 formed of a low molecular weight organic material can be formed by a vacuum evaporation method using masks.

The intermediate layer 133 formed of a polymer organic material generally has a structure in which a HTL and an EML are included. In one embodiment, PEDOT is used as the HTL and polymer organic materials such as poly-phenylenevinylene (PPV) group and polyfluorene can be used as the EML.

An organic light emitting device formed on the substrate 100 is sealed using a facing member (not shown). The facing member can be a glass or plastic material the same as the substrate 100, and can be formed in a metal cap.

In an organic light emitting display device as described above, a light emitting display device that displays correct images according to inputted image signals can be manufactured by including organic TFTs according to embodiments.

In the above embodiments, the embodiments have been described using a structure of an organic light emitting display device, but the invention can be applied to any display device if the display device includes organic TFTs.

An organic TFT according to the embodiments, a method of manufacturing the same, and an organic light emitting display device having the organic TFTs have the following advantages.

First, a channel formed in an organic semiconductor layer can properly contact source and drain electrodes by employing a thin film peel-off preventive layer when a predetermined electrical signal is applied to a gate electrode.

Second, empty spaces do not remain at lower edges of source and drain electrodes. Therefore, when the organic TFTs are applied to a flexible display device, the peel-off of the source and drain electrodes from a gate insulating film formed under the source and drain electrodes can be prevented.

While certain embodiments have been shown and described with reference to drawings, it will be understood by those of ordinary skill in the art that various changes in form and details may be made therein without departing from the spirit and scope of the present invention as defined by the following claims.

What is claimed is:

1. An organic thin film transistor (TFT) comprising:
   a substrate;
   a first insulating layer over the substrate;
   a source electrode and a drain electrode, each being disposed on an upper surface of the first insulating layer, the source and drain electrodes being spaced apart with a gap therebetween, each of the source and drain electrodes having a side surface facing the gap and an upper surface facing away from the substrate;
   an organic semiconductor layer overlying the source and drain electrodes, the organic semiconductor layer further comprising a portion filling the gap between the source and drain electrodes, the organic semiconductor layer consisting essentially of an organic semiconductor material; and
   a peel-off preventive layer comprising:
      a first portion interposed between the side surface of the source electrode and the portion of the organic semiconductor layer,
      a second portion interposed between the side surface of the drain electrode and the portion of the organic semiconductor layer, and
      a third portion interposed between the first insulating layer and the portion of the organic semiconductor layer,
      wherein the peel-off preventive layer is not disposed on the upper surfaces of the source and drain electrodes, and
      wherein the first to third portions of the peel-off preventive layer comprise the same material as one another,
      wherein at least one of the side surfaces of the source and drain electrodes is undercut such that a gap is formed between the at least one side surface and the first insulating layer, and
      wherein the peel-off preventive layer is within at least a portion of the gap.

2. The organic TFT of claim 1, wherein at least one of the side surfaces of the source and drain electrodes and the upper surface of the first insulating layer form an angle of less than 90 degrees.

3. The organic TFT of claim 2, wherein the at least one of the side surfaces of the source and drain electrodes and the upper surface of the first insulating layer form a groove therebetween, and wherein the peel-off preventive layer fills at least a portion of the groove.

4. The organic TFT of claim 3, wherein the peel-off preventive layer contacts the at least one of the side surfaces of the source and drain electrodes and the portion of the organic semiconductor layer.

5. The organic TFT of claim 1, wherein the peel-off preventive layer is formed of an electrically nonconductive material.

6. The organic TFT of claim 1, wherein the organic semiconductor layer comprises another portion extending laterally beyond at least one of the source and drain electrodes, and wherein the peel-off preventive layer further comprises a portion interposed between the other portion of the organic semiconductor layer and the first insulating layer.

7. The organic TFT of claim 1, wherein the peel-off preventive layer is formed of polymeric material.

8. The organic TFT of claim 7, wherein the peel-off preventive layer is formed of at least one material selected from the group consisting of poly(methyl methacrylate), polystyrene, poly(cL-methyl styrene), and polyisobutylene.

9. The organic TFT of claim 1, wherein the source and drain electrodes are formed of a noble metal.

10. The organic TFT of claim 1, further comprising a gate electrode interposed between the first insulating layer and the substrate, the gate electrode overlapping with the gap between the source and drain electrodes.

11. The organic TFT of claim 1, further comprising a second insulating layer over the first insulating layer, the source electrode, and the drain electrode, and further comprising a gate electrode over the second insulating layer, the gate electrode overlapping with the gap between the source and drain electrodes.

12. The organic TFT of claim 1, wherein the substrate is flexible.

13. An electronic device comprising the organic TFT of claim 1.

14. The electronic device of claim 13, wherein the device comprises an organic light-emitting display device.

15. A method of making an organic thin film transistor (TFT), the method comprising:
   forming a first insulating layer over a substrate;
   forming a source electrode and a drain electrode over the first insulating layer such that the source and drain electrodes are spaced apart with a gap therebetween, each of the source and drain electrodes having a side surface facing the gap and an upper surface facing away from the substrate, wherein a portion of the first insulating layer is exposed through the gap;
   forming a peel-off preventive layer comprising a first portion contacting at least a portion of the side surface of the source electrode, a second portion contacting at least a portion of the side surface of the drain electrode, and a third portion substantially covering the portion of the first insulating layer exposed through the gap, wherein the first to third portions of the peel-off preventive layer comprise the same material as one another, wherein the peel-off preventive layer is not disposed on the upper surfaces of the source and drain electrodes;
   forming an organic semiconductor layer over the source and drain electrodes and in the gap between the source and drain electrodes such that the organic semiconductor layer consists essentially of an organic semiconductor material, wherein at least one of the side surfaces of the source and drain electrodes is undercut such that a gap is formed between the at least one side surface and the first insulating layer, and wherein the peel-off preventive layer is within at least a portion of the gap.

16. The method of claim 15, wherein forming the source and drain electrodes comprises wet etching a metallic layer.

17. The method of claim 15, wherein the source and drain electrodes are formed of a noble metal.

18. The method of claim 15, wherein forming the peel-off preventive layer comprises spin coating a peel-off preventive material.

19. The organic TFT of claim 15, wherein the peel-off preventive layer is formed of polymeric material.

20. The method of claim 19, wherein the peel-off preventive layer is formed of at least one material selected from the group consisting of poly(methyl methacrylate), polystyrene, poly(α-methyl styrene), and polyisobutylene.

21. The method of claim 15, further comprising forming a gate electrode over the substrate prior to forming the first insulating layer.

22. The method of claim 15, further comprising, after forming the organic semiconductor layer:

forming a second insulating layer over the organic semiconductor layer; and forming a gate electrode over the second insulating layer.

23. An electronic device comprising an organic thin film transistor made by the method of claim 15.

24. The electronic device of claim 1, wherein the first, second, and third portions of the peel-off preventive layer form a continuous layer contacting the side surface of the source electrode, the first insulating layer, and the side surface of the drain electrode.

25. The method of claim 15, wherein the first, second, and third portions of the peel-off preventive layer form a continuous layer contacting the side surface of the source electrode, the first insulating layer, and the side surface of the drain electrode.

* * * * *